(12) United States Patent
Cheng et al.

(10) Patent No.: US 11,742,836 B1
(45) Date of Patent: Aug. 29, 2023

(54) RANDOM NUMBER GENERATOR USING CROSS-COUPLED RING OSCILLATORS

(71) Applicant: International Business Machines Corporation, Armonk, NY (US)

(72) Inventors: Kangguo Cheng, Schenectady, NY (US); Carl Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/659,211

(22) Filed: Apr. 14, 2022

(51) Int. Cl.
*H03K 3/84* (2006.01)
*H03K 3/03* (2006.01)
*G06F 7/58* (2006.01)
*H03K 19/21* (2006.01)
*H03K 5/22* (2006.01)
*H03K 21/08* (2006.01)

(52) U.S. Cl.
CPC ........... *H03K 3/0315* (2013.01); *G06F 7/588* (2013.01); *H03K 3/84* (2013.01); *H03K 5/22* (2013.01); *H03K 19/21* (2013.01); *H03K 21/08* (2013.01)

(58) Field of Classification Search
CPC ............ G06F 7/58–588; H03K 3/0315; H03K 3/0322; H03K 3/84; H03K 5/22
See application file for complete search history.

(56) References Cited

U.S. PATENT DOCUMENTS

| | | | |
|---|---|---|---|
| 6,061,702 A | 5/2000 | Hoffman | |
| 7,609,542 B2 | 10/2009 | Adams | |
| 7,733,189 B1 * | 6/2010 | Bennett | H03K 3/0315 |
| | | | 323/284 |
| 7,786,816 B2 * | 8/2010 | Dally | H03L 7/07 |
| | | | 331/34 |
| 8,341,201 B2 | 12/2012 | Vasyltsov | |
| 8,990,276 B2 * | 3/2015 | Lazich | H04L 9/0637 |
| | | | 708/250 |
| 9,311,051 B2 | 4/2016 | Kaplan | |
| 9,319,031 B2 | 4/2016 | Green | |
| 9,405,510 B2 | 8/2016 | Karpinskyy | |
| 9,531,354 B1 | 12/2016 | Sim | |
| 9,640,247 B2 | 5/2017 | Chen | |
| 10,140,096 B1 | 11/2018 | Diamant | |
| 10,331,410 B2 | 6/2019 | Wesson | |
| 10,673,443 B1 | 6/2020 | Hassanin | |
| 10,707,839 B1 * | 7/2020 | Oklobdzija | H03B 5/24 |
| 10,742,224 B2 | 8/2020 | Chen | |
| 11,023,207 B1 | 6/2021 | Do | |
| 11,023,208 B2 | 6/2021 | Subramanian | |

(Continued)

OTHER PUBLICATIONS

Li et al., "A Digital TRNG Based on Cross Feedback Ring Oscillators", IEICE Trans. Fundamentals, vol. E97-A, No. 1 Jan. 2014, 8 pages.

(Continued)

*Primary Examiner* — Levi Gannon
(74) *Attorney, Agent, or Firm* — David B. Woycechowsky (57) ABSTRACT

The semiconductor device comprises a first ring oscillator and a second ring oscillator. An input of the first ring oscillator is an end output of the first ring oscillator and an output of the second ring oscillator and wherein an input of the second ring oscillator is an end output of the second ring oscillator and an output of the first ring oscillator.

4 Claims, 8 Drawing Sheets

(56) References Cited

U.S. PATENT DOCUMENTS

| | | | |
|---|---|---|---|
| 2004/0119500 A1* | 6/2004 | Hazucha | H03K 3/0315 |
| | | | 326/93 |
| 2008/0252386 A1* | 10/2008 | Kim | H03K 5/133 |
| | | | 331/57 |
| 2013/0127549 A1* | 5/2013 | Dreux | G06F 21/75 |
| | | | 331/56 |
| 2015/0178048 A1 | 6/2015 | Burleson | |
| 2015/0249441 A1 | 9/2015 | Iravani | |
| 2020/0159497 A1 | 5/2020 | Park | |
| 2021/0312298 A1* | 10/2021 | Kim | G06F 17/10 |
| 2021/0405973 A1 | 12/2021 | Li | |

OTHER PUBLICATIONS

Nannipieri et al., "True Random Number Generator Based on Fibonacci-Galois Ring Oscillators for FPGA", Published: Apr. 7, 2021, 19 pages, <https://doi.org/10.3390/app11083330>.

Ozturk et al., "A Dual Entropy-Based Digital Random Number Generator", Oct. 20, 2021, 9 pages.

Sato et al., "Consideration for Affects of an XOR in a Random Number Generator Using Ring Oscillators", Published: Sep. 5, 2021, 10 pages, <https://www.mdpi.com/1099-4300/23/9/1168>.

Zhang et al., "A 0.11-0.38 pJ/Cycle Differential Ring Oscillator in 65 nm CMOS for Robust Neurocomputing", arXiv:2011.00743v1 [eess.SP] Nov. 2, 2020, 14 pages.

* cited by examiner

RANDOM NUMBER GENERATOR USING CROSS-COUPLED RING OSCILLATORS

BACKGROUND

The present invention relates generally to the field of random number generators, and more particularly to generating random numbers using cross-coupled ring oscillators.

Random number generation is a process by which a sequence of numbers or symbols that cannot be reasonably predicted better than by random chance is generated. True random number generators may be hardware implemented, meaning that they generate a random number as a function of the current value of a physical attribute in an environment that is constantly changing in a manner that is practically impossible to model.

A ring oscillator is a device composed of an odd number of NOT logic gates in a ring. The output of the last logic gate in the ring oscillator feeds the input of the first logic gate in the ring oscillator. The NOT logic gates, or inverters, are attached in a chain.

SUMMARY

Embodiments of the present invention include a semiconductor device. In one embodiment, the semiconductor device comprises a first ring oscillator and a second ring oscillator. An input of the first ring oscillator is an end output of the first ring oscillator and an output of the second ring oscillator and wherein an input of the second ring oscillator is an end output of the second ring oscillator and an output of the first ring oscillator In one embodiment, the semiconductor device comprises a first ring oscillator, a second ring oscillator, and a logic gate. An input of the first ring oscillator is an end output of the first ring oscillator and an output of the second ring oscillator and wherein an input of the second ring oscillator is an end output of the second ring oscillator and an output of the first ring oscillator. The logic gate receives as input the end output of the first ring oscillator and the end output of the second ring oscillator In one embodiment, the semiconductor device comprises two or more cross-coupled ring oscillator pairs, wherein each cross-coupled ring oscillator pair comprises a cross-coupled ring oscillator pair, a first sampling unit that receives the output of the first ring oscillator of the cross-couple ring oscillator pair, a second sampling unit that receives the output of the second ring oscillator, and comparator that receives an output of the first sampling unit and an output of the second sampling unit to produce an output.

DETAILED DESCRIPTION

Embodiments of the present invention recognize that random numbers are essential to a variety of applications. Security key generation in cryptography, statistical simulation such as Monte-Carlo simulations, etc., are some common examples of applications that use random numbers. Software-based pseudo-random number generators (PRNGs) are widely used. However, PRNGs are not a true random number due to the deterministic nature of the software programming.

Embodiments of the present invention recognize that conventional hardware true random number generators (TRNGs) use entropy from natural sources such as, but not limited to, thermal fluctuation and flicker noise, making TRNGs less vulnerable to attack. However, embodiments of the present recognize that TRNGs require analog circuits to convert analog signals into digital signals, posing challenges when integrating the TRNGs into low power digital chips. As a result, some TRNGs may be off-chip, meaning they are fabricated separately with legacy technology nodes and mounted next to advanced digital chips at packaging levels. Embodiments of the present invention recognize that these versions of off-chip TRNGs that communicate between eh TRNG chip and the microprocessor are vulnerable to bus snooping (e.g., side-channel attacks).

Embodiments of the present invention provide a method and structure for forming an on-chip hardware based true random number generator that is fully compatible with digital CMOS technology. Embodiments of the present invention provide for a pair or a group of cross-coupled ring oscillators that oscillate at near identical frequencies. Embodiments of the present invention provide for cross-coupling the inverters to self-correct the mismatch in frequencies between the ring oscillators. Embodiments of the present invention provide for by. Cross-coupling, the slower ring oscillator is sped up by the faster ring oscillator and the faster ring oscillator is slowed down. This provides a self-correction on most mismatch between the ring oscillators, rendering them oscillate at almost near identical frequencies. Embodiments of the present invention recognize that natural fluctuation such as temperature, operation voltage, shot noises during device operation, at a given time, there is an almost equal probability for one ring oscillator to oscillate slightly faster than the other ring oscillator.

Embodiments of the present invention provide for digital counters and/or a comparator to compare the ring oscillator frequencies. Embodiments of the present invention provide for random number (logic "1" or "0") that are generated based on the frequency difference.

It should be noted, throughout the detailed description a logic "1" refers to voltage high and logic "0" refers to voltage low. In a simple example, logic "1" may be 0.8V and logic "0" may be 0V. It should be noted that any voltage range may be used.

Figure 1:
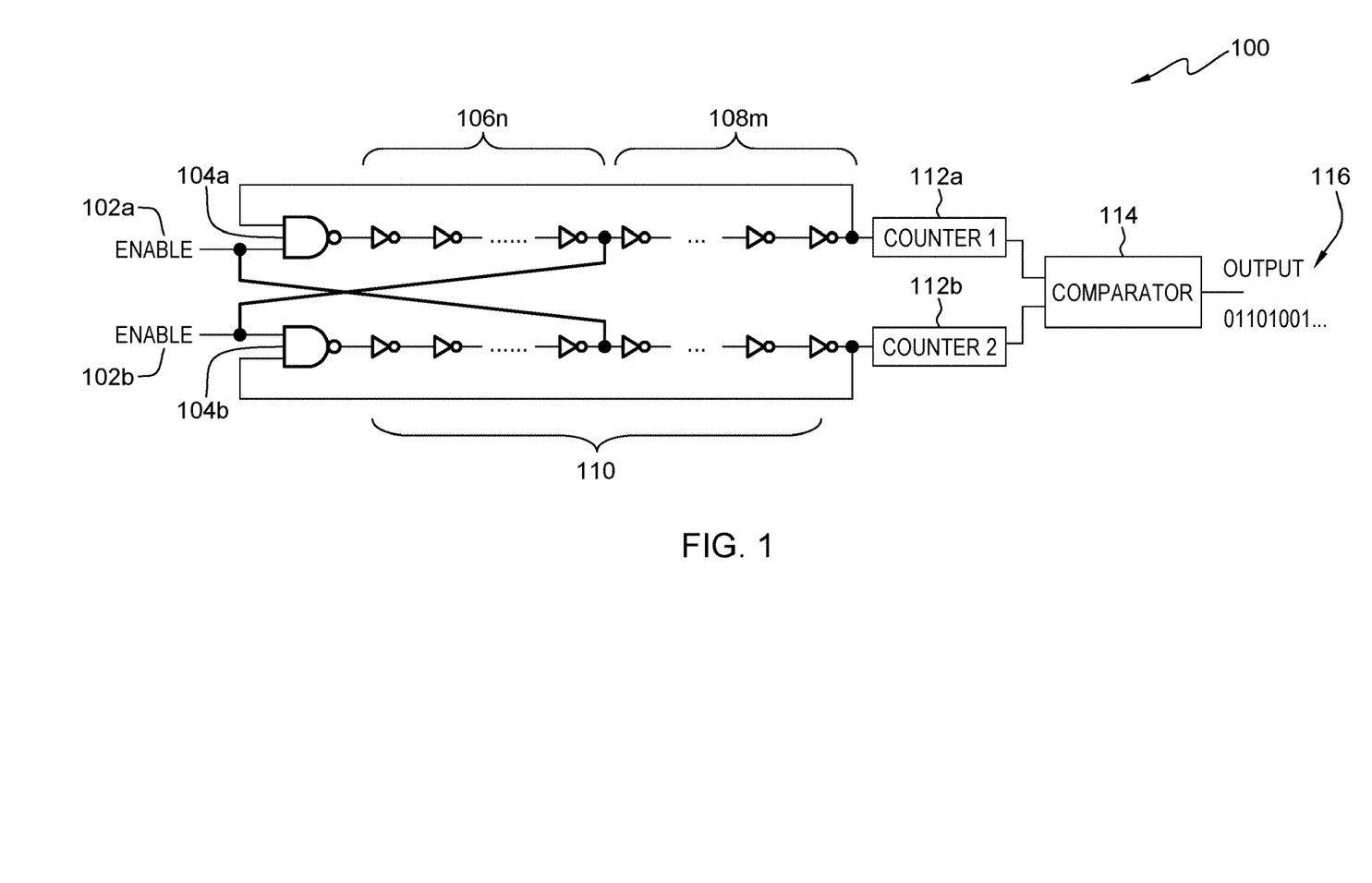
FIG. 1 is a functional block diagram of a semiconductor device, generally designated 100, in accordance with at least one embodiment of the invention.

Referring now to various embodiments of the invention in more detail, FIG. 1 is a functional block diagram of a semiconductor device, generally designated 100, in accordance with at least one embodiment of the invention. FIG. 1 provides only an illustration of one implementation and does not imply any limitation with regard to the environments in which different embodiments may be implemented. Many modifications to the depicted environment may be made by those skilled in the art without departing from the scope of the invention as recited by the claims. Semiconductor device 100 includes a first ring oscillator 102a, a second ring oscillator 102b, a first counter 112a, a second counter 112b, a comparator 114, and an output 116.

In an embodiment, ring oscillator 102a and ring oscillator 102b may each include a first NAND gate 104a and 104b, respectively, along with a series of even number of inverters 110 in sequence after NAND gate 104a and 104b, respectively. In an embodiment, NAND gate 104a is substantially similar to NAND gate 104b. For simplicity, a description of only NAND gate 104a is provided. In an embodiment, the NAND gate 104a is a logical gate that receives two inputs and produces an output which is low or logic "0" if, and only if, all of the inputs to the NAND gate 104a are high or logic "1". In an embodiment, the NAND gate 104a receives as an input, the output from the last NOT inverter logic gate in ring oscillator 102a, also described as an end output or the output from the end of the ring oscillator 102a, and an output from a NOT inverter logic gate that is not the last NOT inverter logic gate in ring oscillator 102b. Here, the end output of ring oscillator 102a is the output of a last inverter in a series in the ring oscillator 102a. Due to the input of ring oscillator 102a being, at least in part from ring oscillator 102b, and vice versa, ring oscillator 102a and ring oscillator 102b are cross-coupled. Therefore, the input to NAND gate 104a for ring oscillator 102a is received from ring oscillator 102a and ring oscillator 102b. Additionally, the input to NAND gate 104b for ring oscillator 102b is received from ring oscillator 102a and ring oscillator 102b.

In an embodiment of the invention, ring oscillator 102a includes a first NAND gate 104a followed by an even number of inverters 110. In an embodiment, an inverter or NOT gate is a logic gate which produces an output representing the opposite logic-level to its input. In an example, a logic "1" may be 0.8V, 5V, or any other voltage as input to the inverter. In this example, the output logic "0" may be 0V as an output of the inverter. In an embodiment, the main function of a NOT inverter is to invert the input signal applied. In other words, if the applied input is low then the output becomes high and vice versa.

In an embodiment, ring oscillator 102a may have the same number of inverters 110 as ring oscillator 102b. In other words, ring oscillator 102a may have a NAND gate 104a and ten inverters 110 and ring oscillator 102b may have a NAND gate 104b and ten inverters 110. In an alternative embodiment, ring oscillator 102a may have a different number of inverters 110 as ring oscillator 102b. In other words, ring oscillator 102a may have a NAND gate 104a and eight inverters 110 and ring oscillator 102b may have a NAND gate 104b and six inverters 110.

In an embodiment, the even number of inverters 110 are separated into the number "n" inverters 106n before the cross-coupling and the number "m" inverters 108m after the cross-coupling. In other words, the output from the last inverter in the "n" number of inverters 106n of ring oscillator 102a is the input to the first inverter of the "m" number of inverters 108m of ring oscillator 102a and the input of the NAND gate 104b of ring oscillator 102b. Additionally, the output from the last inverter in the "n" number of inverters 106n of ring oscillator 102b is the input to the first inverter of the "m" number of inverters 108m of ring oscillator 102b and the input of the NAND gate 104a of ring oscillator 102a.

In an embodiment, ring oscillator 102a and ring oscillator 102b may have the same number "n" inverters 106n before the cross-coupling and the same number "m" inverters 108m after the cross-coupling. In other words, ring oscillator 102a and ring oscillator 102b may each have four "n" inverters 106n before the cross-coupling and four "m" inverters 108m after the cross-coupling. In an embodiment, ring oscillator 102a and ring oscillator 102b may have a different number "n" inverters 106n before the cross-coupling and the number "m" inverters 108m after the cross-coupling. In other words, ring oscillator 102a and ring oscillator 102b may each have four "n" inverters 106n before the cross-coupling and six "m" inverters 108m after the cross-coupling.

In an embodiment, ring oscillator 102a and ring oscillator 102b may have a different number "n" inverters 106n before the cross-coupling and the number "m" inverters 108m after the cross-coupling. In a first example, ring oscillator 102a has four "n" inverters 106n before the cross-coupling and four "m" inverters 108m after the cross-coupling and ring oscillator 102b has two "n" inverters 106n before the cross-coupling and six "m" inverters 108m after the cross-coupling. In a second example, ring oscillator 102a has two "n" inverters 106n before the cross-coupling and six "m" inverters 108m after the cross-coupling and ring oscillator 102b has six "n" inverters 106n before the cross-coupling and two "m" inverters 108m after the cross-coupling. In a third example, ring oscillator 102a has four "n" inverters 106n before the cross-coupling and two "m" inverters 108m after the cross-coupling and ring oscillator 102b has four "n" inverters 106n before the cross-coupling and four "m" inverters 108m after the cross-coupling.

In an embodiment, ring oscillator 102a and ring oscillator 102b may have any number of "n" inverters 106n before the cross-coupling and any number of "m" inverters 108m after the cross-coupling as long as the total number of inverters not including NAND gate 104a is even.

In an embodiment, the output of ring oscillator 102a, in other words the output of the last inverter of the "m" inverters 108m of ring oscillator 102a is fed into counter 112a. Similarly, in an embodiment, output of ring oscillator 102b, in other words the output of the last inverter of the "m" inverters 108m of ring oscillator 102b is fed into counter 112b. In an embodiment, counter 112a and counter 112b keeps a running total of the number of "high" outputs for ring oscillator 102a and ring oscillator 102b, respectively. In other words, counter 112a and counter 112b keeps a running total of the number of logic "1" outputs for ring oscillator 102a and ring oscillator 102b, respectively. In an alternative embodiment, counter 112a and counter 112b keeps a running total of the number of "low" or logic "0" outputs for ring oscillator 102a and ring oscillator 102b, respectively.

In an embodiment, comparator 114 compares the value of counter 112a to the value of counter 112b. In an embodiment, if the values of counter 112a and counter 112b are the same then the output 116 is high or logic "1" and if the values of counter 112a and counter 112b are not the same then the output 116 is low or logic "0". In an alternative embodiment, if the values of counter 112a and counter 112b are the not the same then the output 116 is high or logic "1" and if the values of counter 112a and counter 112b are the same then the output 116 is low or logic "0". In an embodiment, the values of counter 112a and counter 112b are compared by comparator 114 on the rising edge or the falling edge of a sampling clock of a processor, not shown. In an alternative embodiment, the values of counter 112a and counter 112b are compared by comparator 114 at a time frequency or interval using any other timing processes known in the art. In an embodiment, output 116 is a randomly generated number.

Figure 2:
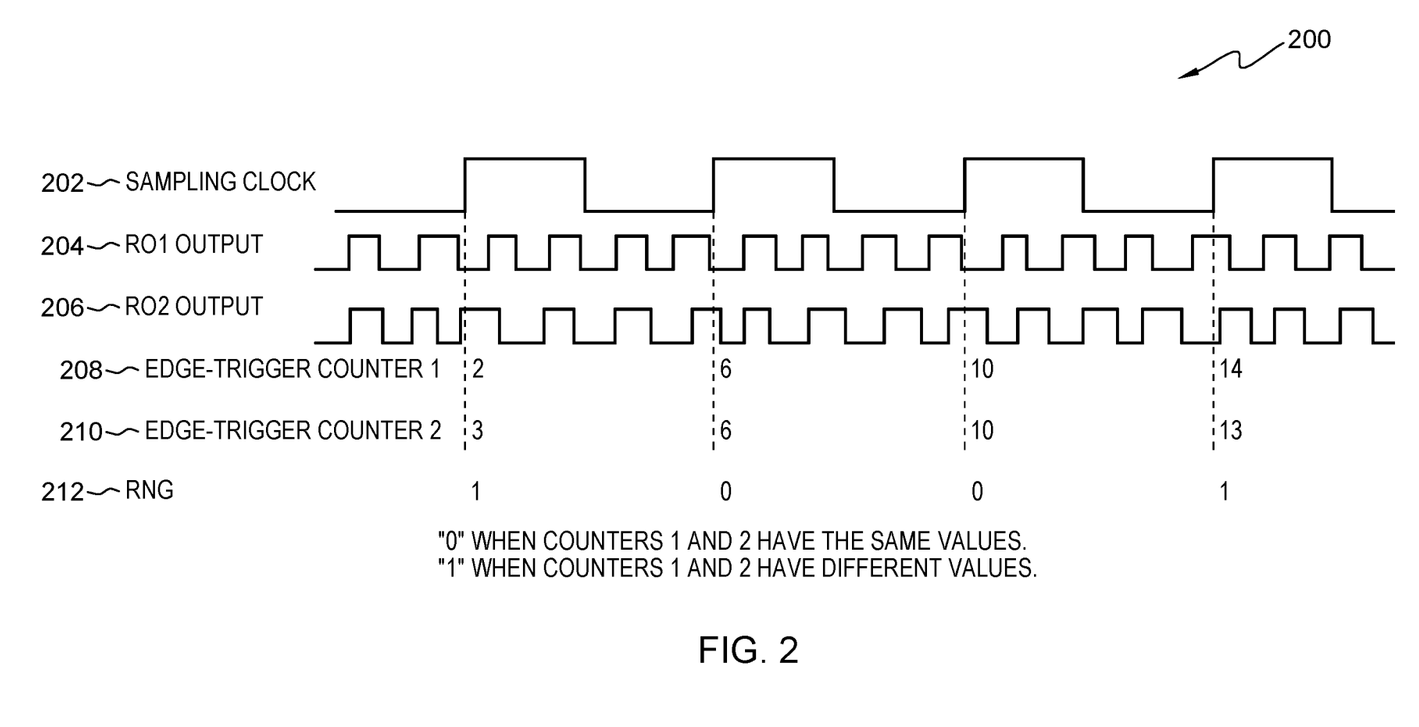
FIG. 2 is a timing diagram of a semiconductor device, generally designated 200, in accordance with at least one embodiment of the invention.

Referring now to various embodiments of the invention in more detail, FIG. 2 is a timing diagram of a semiconductor device, generally designated 200, in accordance with at least one embodiment of the invention. FIG. 2 provides only an illustration of one implementation and does not imply any limitation with regard to the environments in which different embodiments may be implemented. Many modifications to the depicted environment may be made by those skilled in the art without departing from the scope of the invention as recited by the claims.

In an embodiment, sampling clock 202 is a clock rate or clock speed that is generated by the frequency at which the clock generator of a processor can generate pulses. In an alternative embodiment, sampling clock 202 is any frequency of timing that includes a high or logic "1" and a low or a logic "0". In an embodiment, comparing is done by comparator 114 at the rising edge, or the time when low or logic "0" moves to high or logic "1". However, comparator 114 may compare at the falling edge, or the time when high or logic "1" moves to low or logic "0". In yet another alternative embodiment, sampling clock 202 may be any timing that provides a frequency that allows for consistent timing of comparison of counter 112a and counter 112b.

In an embodiment, RO1 output 204 is the output of ring oscillator 102a, in other words the output of the last inverter of the "m" inverters 108m of ring oscillator 102a that is fed into counter 112a. Similarly, RO2 output 206 is the output of ring oscillator 102b, in other words the output of the last inverter of the "m" inverters 108m of ring oscillator 102b that is fed into counter 112b.

In an embodiment, edge-trigger counter 1 208 and edge-trigger counter 2 210 are the running total of high logic "1" output from RO1 output 204 and RO2 output 206, respectively. As shown in FIG. 2, this is done on the rising edge trigger the time the count is totaled for comparison by comparator 114. Further, FIG. 2 shows that a value of low or logic "0" when counters 1 and 2 have the same values or a value of high or logic "1" when counters 1 and 2 have different values.

As shown in FIG. 2, at a first rising edge of sampling clock 202, edge-trigger counter 1 208 has a value of two and edge-trigger counter 2 210 has a value of three therefore the values are different, so RNG 112 is high or logic "1". At a second rising edge of sampling clock 202, edge-trigger counter 1 208 has a value of seven and edge-trigger counter 2 210 has a value of seven, therefore the values are the same so RNG 112 is low or logic "0". At a third rising edge of sampling clock 202, edge-trigger counter 1 208 has a value of ten and edge-trigger counter 2 210 has a value of ten, therefore the values are the same so RNG 112 is low or logic "0". At a fourth rising edge of sampling clock 202, edge-trigger counter 1 208 has a value of fourteen and edge-trigger counter 2 210 has a value of thirteen, therefore the values are different, so RNG 112 is low or logic "0".

Figure 3:
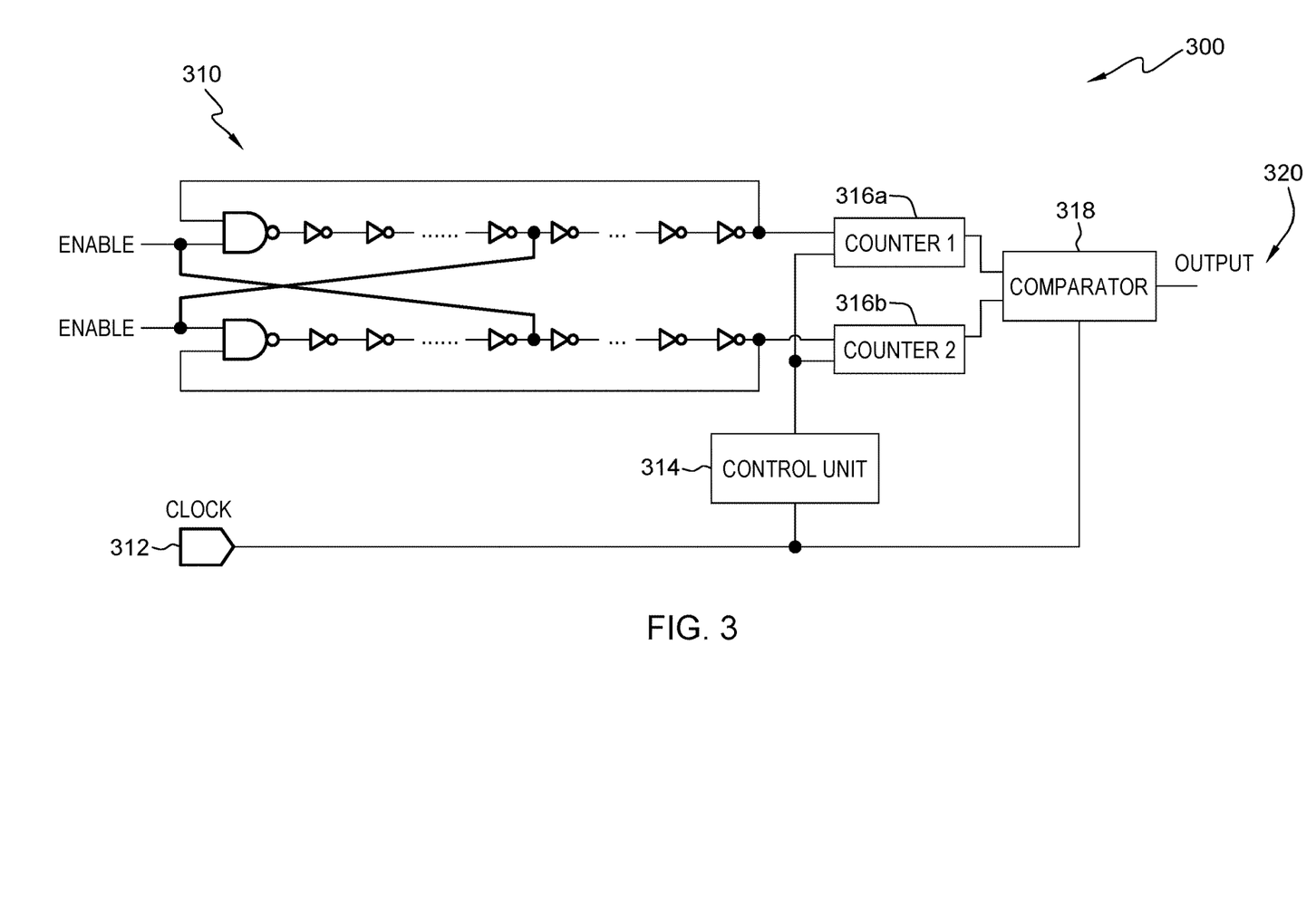
FIG. 3 is a functional block diagram of a semiconductor device, generally designated 300, in accordance with at least one embodiment of the invention.

Referring now to various embodiments of the invention in more detail, FIG. 3 is a functional block diagram of a semiconductor device, generally designated 300, in accordance with at least one embodiment of the invention. FIG. 3 provides only an illustration of one implementation and does not imply any limitation with regard to the environments in which different embodiments may be implemented. Many modifications to the depicted environment may be made by those skilled in the art without departing from the scope of the invention as recited by the claims.

In an embodiment, semiconductor device 300 includes a pair of cross-coupled ring oscillators 310 substantially similar to those discussed in FIG. 1 and FIG. 2. As discussed in reference to FIG. 1 and FIG. 2, the output of the pair of cross-coupled ring oscillators 310 are fed into counter 1 316a and counter 2 316b. Counter 1 316a and counter 2 316b are substantially similar to counter 1 112a and counter 2 112b. In an embodiment, clock 312 is a clock rate or clock speed that is generated by the frequency at which the clock generator of a processor can generate pulses. In an embodiment, clock 312 may be used to drive the delay unit (not shown). In an embodiment, clock 312 may be used to synchronize the output 320 by driving the comparator 318. In an embodiment, clock 312 is fed into control unit 314 and comparator 318.

In an embodiment, control unit 314 generates the appropriate timing and control signals to counter 316a and counter 316b to properly count the signals from the pair of cross-coupled ring oscillators 310. In an embodiment, the cross-coupled ring oscillators 310 may need some time (i.e., 100 nanoseconds) to go through meta stable state before reaching the stable oscillation mode. In an embodiment, control unit 314 may be used to delay the start of counter 316a and counter 316b until the cross-coupled ring oscillators 310 are in stable oscillation state. In an alternative embodiment, a timer (not shown) may be integrated with counter 1 316a and counter 2 316b in order to delay until stable oscillation state occurs. In an embodiment, control unit 314 may include a RESET unit (not shown) that resets and restarts counter 1 316a and/or counter 2 316b in case the random number generator bias strongly towards high or logic "1" or low or logic "0". In an embodiment, comparator 318 is substantially similar to comparator 114. In an embodiment, comparator 318 receives clock 312 in order to determine when to compare counter 1 316a and counter 2 316b in order to product output 320. In an embodiment, output 320 is the randomly generated number.

Figure 4:
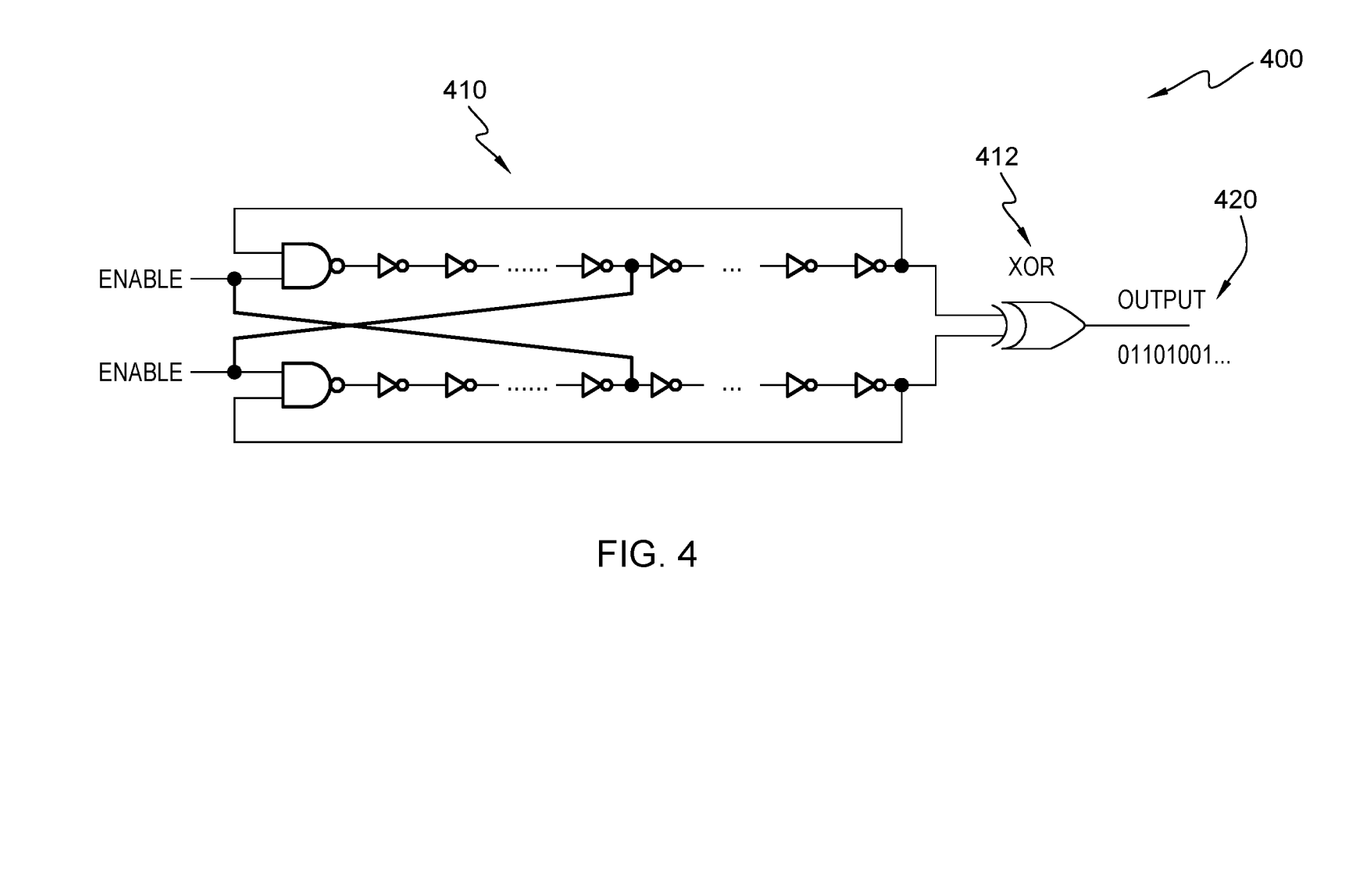
FIG. 4 is a functional block diagram of a semiconductor device, generally designated 400, in accordance with at least one embodiment of the invention.

Referring now to various embodiments of the invention in more detail, FIG. 4 is a functional block diagram of a semiconductor device, generally designated 400, in accordance with at least one embodiment of the invention. FIG. 4 provides only an illustration of one implementation and does not imply any limitation with regard to the environments in which different embodiments may be implemented. Many modifications to the depicted environment may be made by those skilled in the art without departing from the scope of the invention as recited by the claims.

In an embodiment, semiconductor device 400 includes a pair of cross-coupled ring oscillators 410 substantially similar to those discussed in FIG. 1 and FIG. 2. In this embodiment, the output of the pair of cross-coupled ring oscillators 410 are fed into a logic gate, in this case an XOR logic gate 412. In an embodiment, the XOR logic gate 412 functions as a digital logic gate that give a high or "1" logic when the number of inputs is odd. In other words, if a single input is high or "1" then the output is high or "1". Further, if both input is high or "1" or both input are low or "0" then the output is low or "0". In an embodiment, the output 420 of the XOR logic gate 412 is the randomly generated number.

Figure 5:
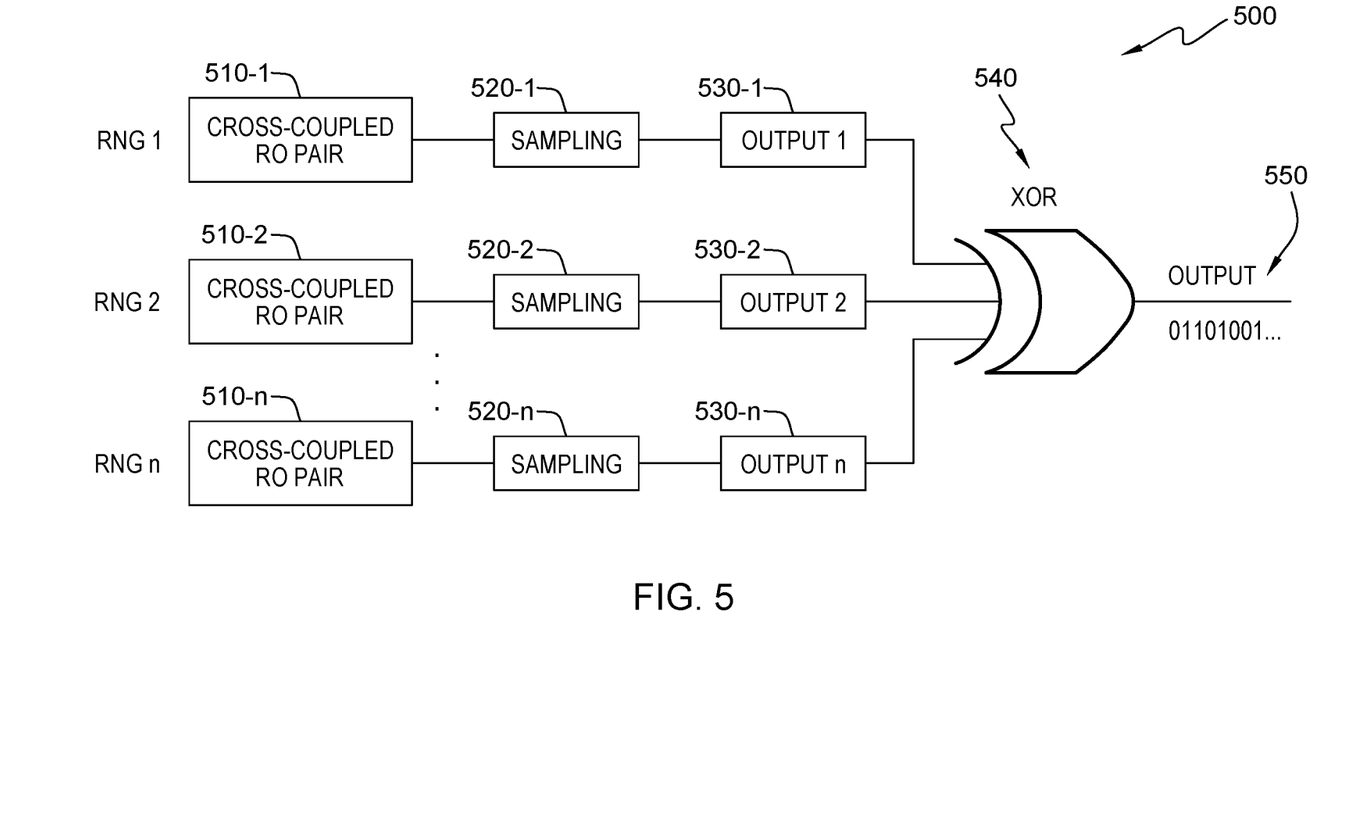
FIG. 5 is a functional block diagram of a semiconductor device, generally designated 500, in accordance with at least one embodiment of the invention.

Referring now to various embodiments of the invention in more detail, FIG. 5 is a functional block diagram of a semiconductor device, generally designated 500, in accordance with at least one embodiment of the invention. FIG. 5 provides only an illustration of one implementation and does not imply any limitation with regard to the environments in which different embodiments may be implemented. Many modifications to the depicted environment may be made by those skilled in the art without departing from the scope of the invention as recited by the claims.

In an embodiment, a random number generator includes a cross-coupled RO pair 510-1, sampling 520-1, and output 530-1. In an embodiment, cross-couple RO pair 510-1 is substantially similar to those discussed in FIG. 1 and FIG. 2. In an embodiment, sampling 520-1 are substantially similar to counter 1 112a, counter 2 112b, and comparator 114, as discussed in FIG. 1 and FIG. 2. In an embodiment, output 530-1 is substantially similar to output 116. In an embodiment, semiconductor device 500 includes three random number generator, RNG 1, RNG 2, RNG n. In an embodiment, semiconductor device 500 may include any number of random number generator.

In an embodiment, the output of RNG 1, RNG 2, and RNG n is fed into an XOR logic gate 540. In an embodiment, an XOR logic gate 540 is a digital logic gate that has an output of high or logic "1" when the number of inputs that are high or logic "1" are odd. In this example, with three inputs, the XOR logic gate 540 will have an output of high or logic "1" if only a single input is high or logic "1", or all three of the input are high or logic "1". If all of the input are low or logic "0" or if only one of the input is high or logic "1", then the output of the XOR logic gate 540 will be low or logic "0". In an embodiment, the output 550 of the XOR logic gate 540 is the random number generated.

Figure 6:
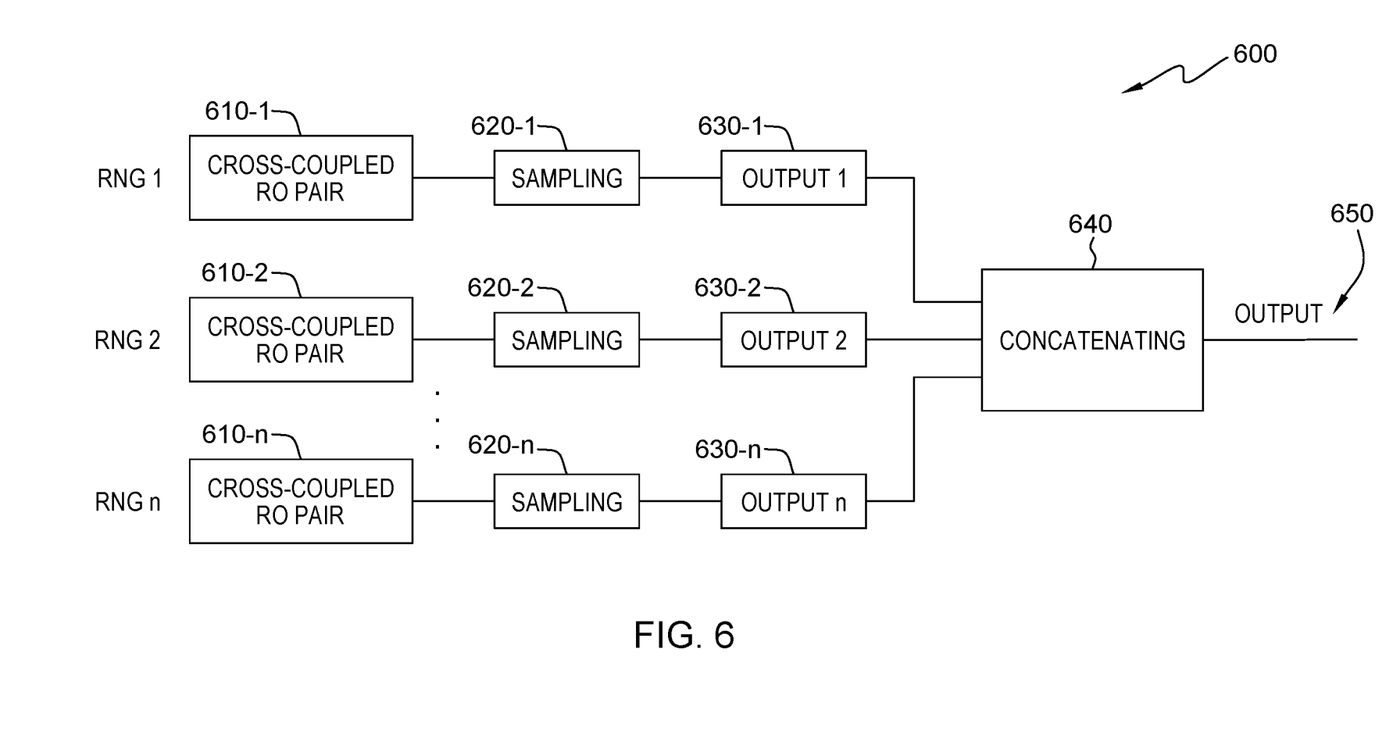
FIG. 6 is a functional block diagram of a semiconductor device, generally designated 600, in accordance with at least one embodiment of the invention.

Referring now to various embodiments of the invention in more detail, FIG. 6 is a functional block diagram of a semiconductor device, generally designated 600, in accordance with at least one embodiment of the invention. FIG. 6 provides only an illustration of one implementation and does not imply any limitation with regard to the environments in which different embodiments may be implemented. Many modifications to the depicted environment may be made by those skilled in the art without departing from the scope of the invention as recited by the claims.

In an embodiment, a random number generator includes a cross-coupled RO pair 610-1, sampling 620-1, and output 630-1. In an embodiment, cross-couple RO pair 610-1 is substantially similar to those discussed in FIG. 1 and FIG. 2. In an embodiment, sampling 620-1 are substantially similar to counter 1 112a, counter 2 112b, and comparator 114, as discussed in FIG. 1 and FIG. 2. In an embodiment, output 630-1 is substantially similar to output 116. In an embodiment, semiconductor device 600 includes three random number generator, RNG 1, RNG 2, RNG n. In an embodiment, semiconductor device 600 may include any number of random number generator.

In an embodiment, the output 630-1 of RNG 1, the output 630-2 of RNG 2, and output 630-n of RNG n are inputs to concatenating device 640. In an embodiment, concatenating device 640 receives the input of multiple RNG and produces an output 650 that is the randomly generated number. In an embodiment, the concatenating device 640 receives the outputs of multiple RNG together to improve the throughput of the RNG. In an embodiment, the concatenating device takes a first output number from RNG 1, for example high or logic "1" and then takes the first output number of RNG 1, for example low or logic "0" and then finally takes the first output number of RNG n, for example low or logic "0", to produce a randomly generated number of "100". In this example, the concatenating device 640 has tripled the output of the RNG by combining three RNG (i.e., RNG 1, RNG 2, and RNG n). It should be noted, the concatenating device 640 can take a single output from each RNG, multiple output from an RNG, or any combination of outputs from an RNG to create the final output 650. In an example, concatenating device 640 may take the first three output of RNG 1 (i.e., 100), then add the first three output of RNG 2 (i.e., 010), and then add the first three output of RNG n (i.e., 111), producing a nine bit output (i.e., 100010111).

Figure 7:
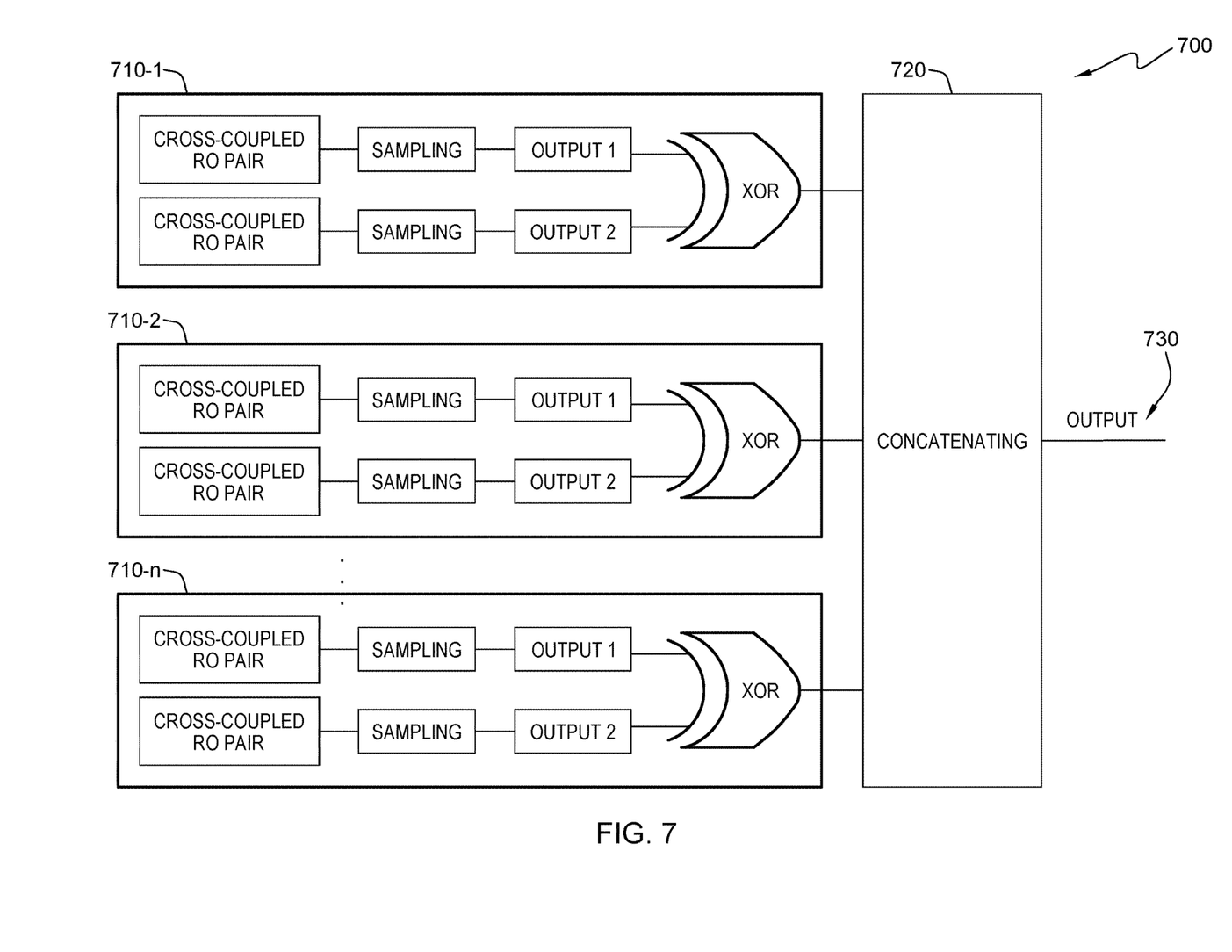
FIG. 7 is a functional block diagram of a semiconductor device, generally designated 700, in accordance with at least one embodiment of the invention.

Referring now to various embodiments of the invention in more detail, FIG. 7 is a functional block diagram of a semiconductor device, generally designated 700, in accordance with at least one embodiment of the invention. FIG. 7 provides only an illustration of one implementation and does not imply any limitation with regard to the environments in which different embodiments may be implemented. Many modifications to the depicted environment may be made by those skilled in the art without departing from the scope of the invention as recited by the claims.

In an embodiment, the semiconductor device 700 includes aspects of semiconductor device 500 and semiconductor device 600. In an embodiment, 710-1, 710-2, and 710-n are substantially similar to semiconductor device 500. The output 550 of semiconductor device 500, as shown in FIG. 7 is the output of 710-1, 710-2, and 710-n. In other words, each of 710-1, 710-2, and 710-n produce an output and the output is fed into concatenating device 720. Concatenating device 720 is substantially similar to concatenating device 640, and takes the outputs of each semiconductor device 710-1, 710-2, and 710-n to produce output 730 which is a randomly generated number.

Figure 8:
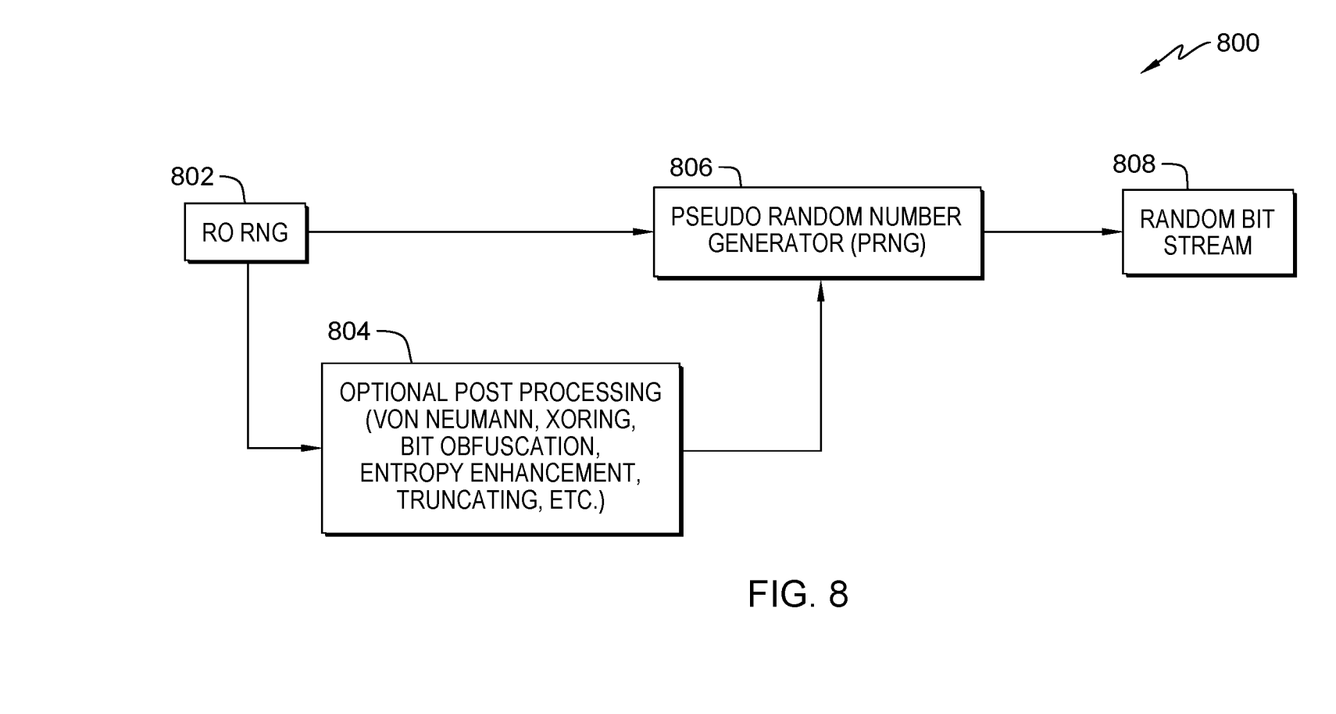
FIG. 8 is a flow chart diagram depicting operational steps for a program for random number generation, in accordance with at least one embodiment of the invention.

Referring now to various embodiments of the invention in more detail, FIG. 8 is a workflow 800 depicting operational steps for post processing of random number generation, in accordance with at least one embodiment of the invention. FIG. 8 provides only an illustration of one implementation and does not imply any limitation with regard to the environments in which different embodiments may be implemented. Many modifications to the depicted environment may be made by those skilled in the art without departing from the scope of the invention as recited by the claims. It should be noted, the program performing workflow 800 may be part of the operating system of a computing device or any other stand-alone program that can perform these functions.

In an embodiment, as discussed above, the cross-coupled ring oscillators described in any embodiment of FIGS. 1-7 may produce a cross-couple ring oscillator random number generator, RO RNG 802. In an embodiment, RO RNG 802 may perform optional post processing steps, as discussed below, in step 804. In an embodiment, this post-processing may be to remove bias of high or logic "1" or low or logic "0". In an embodiment, RO RNG 802 or the optional post processed RO RNG (via step 804) may proceed to the pseudo number generator step 806. In an embodiment, step 806 is the software interface a user may interact with using a computing device or any of the devices discussed above to produce the random number. In an embodiment, step 808 produces the random bit stream, in other words the random number, for use a computing device and/or user.

It should be noted, in any of the embodiments the output randomly generated number may have some bias towards high or logic "1" or low or logic "0". In an embodiment, this bias may be minimized using any post processing operations known in the art. For example, in the case of a bias towards high or logic "1", this can be minimized by an XOR logic gate of the neighboring bits of the RNG output or by an XOR logic gate of the two sets of outputs of a single RNG, or further by an XOR logic gate of the outputs of two RNGs. In an embodiment, the Von Neumann method may be used to reduce both high or logic "1" or low or logic "0" bias. In yet another embodiment, bit obfuscation, entropy enhancement, truncating, etc. may be used to reduce biasing.

The invention claimed is:

1. An electronic device for producing a two bit parallel output stream which can be used to generate random numbers, the electronic device comprising:
   a first logic gate including a first input, second input and an output;
   a second logic gate including a first input, second input and an output;
   a first plurality of inverters electrically connected in series;
   a second plurality of inverters electrically connected in series;
   a third plurality of inverters electrically connected in series; and
   a fourth plurality of inverters electrically connected in series;
   wherein:
   the first input of the first logic gate is electrically connected to the output of the second plurality of inverters;
   the second input of the first logic gate is electrically connected to the output of the third plurality of inverters;
   the first input of the second logic gate is electrically connected to the output of the first plurality of inverters;
   the second input of the second logic gate is electrically connected to the output of the fourth plurality of inverters;
   the output of the first logic gate is electrically connected to the input of the first plurality of inverters;
   the output of the second logic gate is electrically connected to the input of the third plurality of inverters;
   the output of the first plurality of inverters is electrically connected to the input of the second plurality of inverters;
   the output of the third plurality of inverters is electrically connected to the input of the fourth plurality of inverters;
   the outputs of the second and fourth pluralities of inverters deliver the two bit output stream that can be used to create random numbers; and
   random number creation circuitry including a first input, a second input and an output;
   wherein the first input of the random number creation circuitry is electrically connected to the output of the second plurality of inverters, the second input of the random number creation circuitry is electrically connected to the output of the fourth plurality of inverters, and the output delivers a stream of random numbers.

2. The device of claim 1 wherein the first and second logic gates are NAND gates.

3. The device of claim 1 wherein the random number creation circuitry includes a comparator that includes a first input, a second input and an output that delivers the stream of random numbers.

4. The device of claim 1 wherein the random number creation circuitry includes:
   a comparator that includes a first input, a second input and an output that delivers the stream of random numbers;
   a first counter; and
   a second counter;
   wherein an input of the first counter is electrically connected to the output of the second plurality of inverters, an input of the second counter is electrically connected to the output of the fourth plurality of inverters, an output of the first counter is electrically connected to the first input of the comparator, and an output of the second counter is electrically connected to the second input of the comparator.

* * * * *